United States Patent

Kosakowski

[15] 3,685,043

[45] Aug. 15, 1972

[54] PULSE TRAIN TO DIGITAL CONVERTER

[72] Inventor: Henry R. Kosakowski, Lyndhurst, N.J.

[73] Assignee: The Bendix Corporation

[22] Filed: Sept. 25, 1970

[21] Appl. No.: 75,508

[52] U.S. Cl...............340/347 DD, 307/225, 328/16, 328/155, 331/1 R, 331/14

[51] Int. Cl......G08c 13/00, H03k 5/18, H03k 13/14

[58] Field of Search.................340/347 NT, 347 DD; 328/16–18, 20, 155; 307/225; 331/1, 14, 17, 18–29; 178/69.5, 53

[56] References Cited

UNITED STATES PATENTS

| | | | |
|---|---|---|---|
| 3,557,308 | 1/1971 | Alexander et al. | 328/155 X |
| 3,458,823 | 7/1969 | Nordahl | 328/155 |
| 3,533,009 | 10/1970 | Sordello | 331/14 X |

*Primary Examiner*—Maynard R. Wilbur
*Assistant Examiner*—Thomas J. Sloyan
*Attorney*—Anthony F. Cuoco and Plante, Hartz, Smith and Thompson

[57] ABSTRACT

A pulse train to digital converter including improved frequency multiplying means whereby the multiplication is virtually unrestricted in magnitude and is a closed loop function for improving accuracy and stability of the converter.

5 Claims, 10 Drawing Figures

INVENTOR.
HENRY R. KOSAKOWSKI
BY
ATTORNEY

VOLTAGE CONTROLLED OSCILLATOR - 8

INVENTOR.
HENRY R. KOSAKOWSKI
BY Anthony J. Rosso
ATTORNEY

INVENTOR.
HENRY R. KOSAKOWSKI
BY
[signature]
ATTORNEY

INVENTOR.
HENRY R. KOSAKOWSKI
BY Anthony J. Ineoco
ATTORNEY

INVENTOR.
HENRY R. KOSAKOWSKI
BY Anthony J. Rocco
ATTORNEY

INVENTOR.
HENRY R. KOSAKOWSKI
BY [signature]
ATTORNEY

PULSE TRAIN TO DIGITAL CONVERTER

BACKGROUND OF THE INVENTION

1. Field of the Invention

This invention relates to apparatus for converting pulse trains to digital information. More particularly, this invention relates to converters of the type described, including frequency multipliers for simplifying conversion of low frequency pulse trains.

2. Description of the Prior Art

Computer applications require the conversion of pulse trains into digital form. The conversion is particularly troublesome because more often than not low frequencies are encountered. Frequency multipliers are used to overcome this disadvantage, but prior to the present invention the multipliers were inaccurate and had limited input and output frequency ranges so as to reduce the overall effectiveness of the converter.

SUMMARY OF THE INVENTION

The present invention overcomes the aforenoted disadvantages and contemplates a pulse train to digital converter wherein the input frequency and its multiple are converted to corresponding linear d.c. voltages with a predetermined attenuation factor between them. The d.c. voltages are continuously compared to each other, and when both are equal multiplication by the predetermined factor is accomplished.

One object of this invention is to provide a pulse train to frequency converter having improved frequency multiplication means whereby the overall effectiveness of the converter is enhanced.

Another object of this invention is to provide frequency multiplication means so that there is virtually no restriction on the magnitude of the multiplication factor and so that said factor is not restricted to an integer value.

Another object of this invention is to minimize disadvantages of prior art pulse train to digital converters such as limited input and output frequency ranges and slow conversion rates.

Another object of this invention is to accomplish the aforenoted frequency multiplication as a closed loop function for improving accuracy and stability.

The foregoing and other objects and advantages of the invention will appear more fully hereinafter from a consideration of the detailed description which follows, taken together with the accompanying drawings wherein one embodiment of the invention is illustrated by way of example. It is to be expressly understood, however, that the drawings are for illustration purposes only and are not to be construed as defining the limits of the invention.

DESCRIPTION OF THE INVENTION

Figure 1:
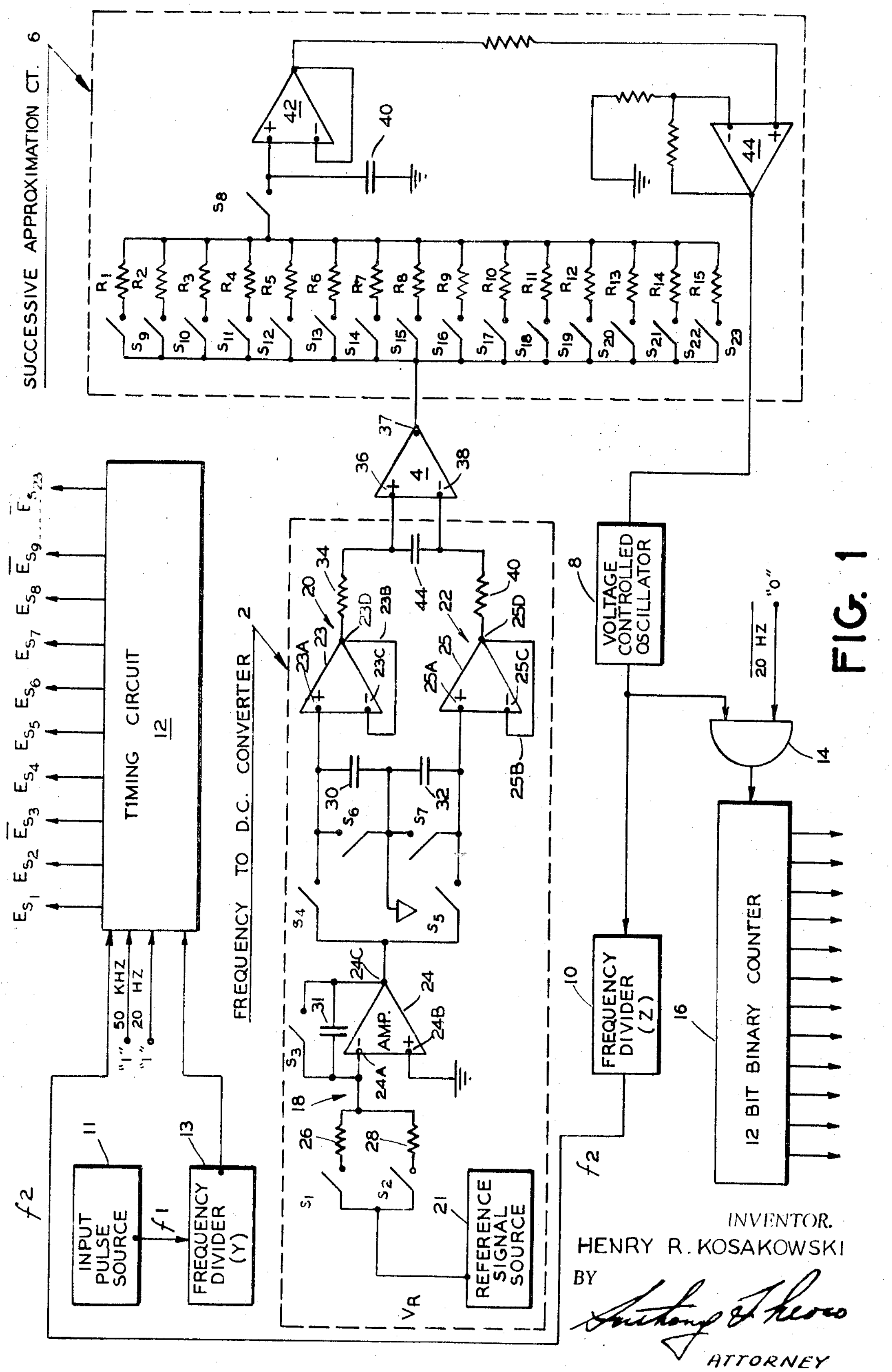
FIG. 1 is a block diagram-electrical schematic of a pulse train to digital converter according to the invention.

With reference to FIG. 1, a pulse train to digital converter according to the invention includes a frequency to d.c. converter designated generally by the numeral 2 and a comparator 4 which compares a pair of signals provided by the converter in response to a reference signal $V_R$ from a reference signal source 21. Comparator 4 drives a successive approximation circuit 6 which, in turn, affects a voltage controlled oscillator 8 for providing a train of pulses. A frequency divider 10 divides the frequency of the pulse train by a predetermined factor Z, and provides a signal having a frequency $f_2$.

Frequency divider 10 may be a device of the type well known in the art such as described at Chapter 19, pages 716–744, *Pulse, Digital and Switching Waveforms*, Millman and Taub, McGraw Hill, 1965.

An AND gate 14, controlled by a signal at a logic "0" level from a 20 Hz clock, gates the pulses from oscillator 8 to a binary counter 16, and which counter counts the pulses and provides a corresponding digital output.

An input pulse train from a pulse source 11 and having a frequency $f_1$, and for which frequency it is desired to provide a corresponding digital output, is applied to a frequency divider 13 which divides the frequency by a predetermined factor Y and provides a signal which is applied to a timing circuit 12 as is the signal from frequency divider 10 and having frequency $f_2$. Frequency divider 13 is structurally similar in all respects to frequency divider 10 heretofore referred to.

Control signals at a logic "1" level from a 50 KHz clock and from the 20 Hz clock are applied to timing circuit 12. The timing circuit is responsive to the aforenoted inputs for providing signals $\overline{E_{S_1}} - \overline{E_{S_{23}}}$ at logic "0" and logic "1" levels for operating normally open switches $S_1 - S_7$ in frequency to d.c. converter 2 and normally open switches $S_8$ and $S_9 - S_{23}$ in successive approximation circuit 6. As shown in the figure and as will be the case in the discussion to follow, signals at a logic "0" level carry a "bar" designation ($\overline{E}_{S_9}$ for example) as will now be understood by those skilled in the art. It should be noted that for purposes of simplicity the aforenoted switches are shown as relay contacts but actually they may be current flow control devices such as field effect transistors which are rendered conductive and non-conductive by the signals from timing circuit 12 as will be hereinafter explained.

With further reference to FIG. 1, frequency to d.c. converter 2 includes an integrator 18 and a pair of sample and hold circuits 20 and 22. Integrator 18 includes an amplifier 24 having an inverting input terminal 24A, a grounded non-inverting input terminal 24B and an output terminal 24C. A capacitor 31 is connected in feedback configuration to terminals 24A and 24C of amplifier 24 and switch $S_3$ is connected in parallel with capacitor 31. Signal source 21 is connected to inverting input terminal 24A of amplifier 24 through switch $S_1$ connected to the output of signal source 21 and a resistor 26 connected to the switch and to terminal 24A, and through switch $S_2$ connected to the output of the signal source and a resistor 28 connected to the switch and to terminal 24A.

Sample and hold circuit 20 includes an amplifier 23 having a non-inverting input terminal 23A connected to output terminal 24C of amplifier 24 through switch $S_4$, and sample and hold circuit 22 includes an amplifier 25 having a non-inverting input terminal 25A connected to output terminal 24C of amplifier 24 through switch $S_5$. Switch $S_6$ connects terminal 23A of amplifier 23 to ground and switch $S_7$ connects terminal 25A of amplifier 25 to ground.

A capacitor 30 is connected in parallel with switch $S_6$ and a capacitor 32 is connected in parallel with switch $S_7$. Amplifier 23, connected in voltage follower configuration, has an inverting input terminal 23C connected to an output terminal 23D through a feedback conductor 23B and amplifier 25, connected in voltage follower configuration, has an inverting input terminal 25C connected to an output terminal 25D through a feedback conductor 25B.

Output terminal 23D of amplifier 23 is connected through a resistor 34 to a non-inverting input terminal 36 of comparator 4 and output terminal 25D of amplifier 25 is connected through a resistor 40 to an inverting input terminal 38 of comparator 4. A capacitor 44 is connected across inverting and non-inverting input terminals 36 and 38, respectively, of comparator 4.

Integrator 18 is used as a pulse train to d.c. converter by allowing capacitor 31 to charge during a half cycle of input frequency $f_1$. The rate at which charging occurs is controlled by reference signal $V_R$ and resistors 26 and 28. The ratio $R_{28}/R_{26}$ is an attenuation factor X, the significance of which will be hereinafter explained.

With switch $S_3$ open and switch $S_1$ closed by appropriate signals $\overline{E}_{S_3}$ and $E_{S_1}$, respectively, from timing circuit 12, voltage $V_{f_1}$ associated with frequency $f_1$ is converted to d.c. as follows:

$$V_{f_1}=\frac{-V_R\times\frac{1}{2}T_1}{R_{26}C_{31}} \qquad (1)$$

where $T_1$ is the period of input frequency $f_1$. During the time that switch $S_1$ is closed, switch $S_4$ is also closed by signal $E_{S_4}$ allowing capacitor 30 in sample and hold circuit 20 to charge to the output voltage of integrator 18.

After the voltage associated with frequency $f_1$ has been converted to d.c., switches $S_4$ and $S_1$ open in response to signals $E_{S_4}$ and $E_{S_1}$ and switches $S_3$ and $S_2$ close in response to signal $E_{S_3}$ and $E_{S_2}$, respectively. The voltage associated with input frequency $f_1$ is now stored by capacitor 30. Switch $S_3$ remains closed long enough to discharge capacitor 31 to zero. The voltage associated with frequency $f_2$ is converted to d.c. and charges capacitor 32 according to the following equation:

$$V_{f_2}=\frac{V_R\times\frac{1}{2}T_2}{R_{28}C_{30}} \qquad (2)$$

where $T_2$ is the period of frequency $f_2$.

At the null point of the system the following relationships apply:

$$V_{f_1}=V_{f_2};$$

$$\frac{V_R T_{1/2}}{R_1C_1}=\frac{V_R T_{2/2}}{R_2C_1};$$

$$\frac{R_2}{R_1}=\frac{T_{2/2}}{T_{1/2}}=\frac{f_1}{f_2}=X \qquad (3)$$

where X is the aforenoted attenuation factor.

The frequency multiplication factor, $F_M$, is established by division factor Z (frequency divider 10), division factor Y (frequency divider 13) and attenuation factor X.

$$F_M=z/xy \qquad (4)$$

Comparator 4 is a device of the type well known in the art such as the operational amplifier described at page 359, *Electronics For Scientists*, Malmstadt, et al., W.A. Benjamin, Inc., 1963. The purpose of comparator 4 is to deliver voltage in the proper sense to successive approximation circuit 6. In this connection it should be noted that comparator 4 should be so selected that its gain, voltage off-set and slew rate are consistent with accuracy requirements.

Successive approximation circuit 6 shown in FIG. 1 functions in a manner similar to a successive approximation analog to digital converter and serves to change the frequency of the pulses from voltage controlled oscillator 8 until a null frequency is obtained. To this end, successive approximation circuit 6 includes a network of resistors $R_1 - R_{15}$ connected in parallel and ranging from R to some binary multiplication ($2^n$) of R for generating a control voltage for oscillator 8. Each of the resistors $R_1 - R_{15}$ is successively switched into a common node through switches $S_9 - S_{23}$, with each switch being serially connected to a corresponding resistor of the resistors $R_1 - R_{15}$ and connected to an output terminal 37 of comparator 4. The resistors successively switched into the common node cause charging and discharging of a capacitor 40 connected to successive approximation circuit 6 through a normally open switch $S_8$, and which switch is closed by signal $E_{S_8}$ from timing circuit 12. The rate of charge and discharge of capacitor 40 depends on the time characteristic of the capacitor and upon the output of comparator 4 at output conductor 37.

The frequency of the pulses from voltage controlled oscillator 8 is increased or decreased depending on the voltage stored by capacitor 40 and applied to the oscillator 8 through a high input impedance buffer amplifier 42 and a gain adjusting amplifier 44. As each successively larger valued resistor of the resistors $R_1 - R_{15}$ is switched into the common node, the rate at which capacitor 40 charges or discharges is successively reduced. As a consequence, the rate of increase or decrease in frequency of the pulses from oscillator 8 continuously reduces which, in effect, forces the frequency of the pulses from the oscillator to approach frequency $f_1$.

Each time a new resistor of the resistors $R_1 - R_{15}$ is connected, sufficient time is allowed for the new frequency $f_2$ to be converted to d.c. and compared with d.c. associated with frequency $f_1$ before the sequence is repeated with a larger resistor. This is accomplished by weighting the values of the resistors so that the value of the parallel combination of all the resistors, after the last resistor is connected, is greater than or equal to the value of the last resistor connected. For example, the voltage change on capacitor 40 due to $R_K$ can always be cancelled by the sum of the voltage changes due to $R_{K+2}$ to $R_N$.

Figure 2:
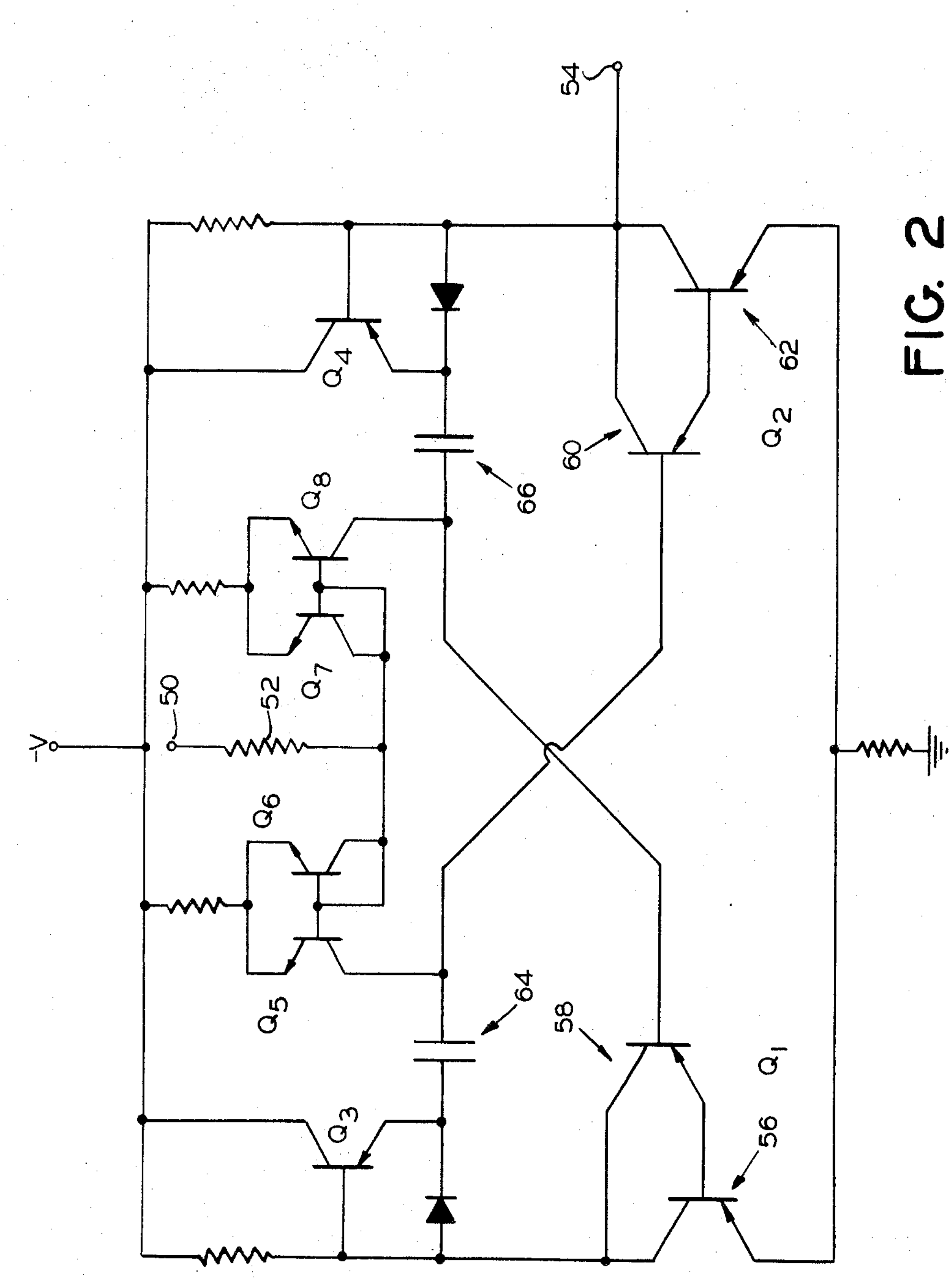
FIG. 2 is an electrical schematic diagram of a voltage control oscillator 8 included in the converter of FIG. 1.

With reference now to FIG. 2, wherein voltage controlled oscillator 8 is shown in substantial detail, it will be recognized that the circuit is similar to that of a conventional astable multivibrator with several modifications to accommodate the requirements of the invention. To this end, oscillator 8 is driven by a suitable source of negative direct current −V and receives the output from amplifier 44 in successive approximation circuit 6 (FIG. 1) at an input terminal 50 and through a resistor 52. Oscillator 8 includes a pair of transistors 56 and 58 arranged to provide a Darlington pair $Q_1$ and another pair of transistors 60 and 62 arranged to provide a Darlington pair $Q_2$. The output from oscillator 8 is provided at an output terminal 54 connected to the collector of transistor 60 in Darlington pair $Q_2$.

Darlington pairs $Q_1$ and $Q_2$ are used to reduce the discharging effect of transistor input resistance on capacitors 64 and 66 included in oscillator 8. As a result of the Darlington configuration, less charging current is required for capacitors 64 and 66 to turn on or render conductive the transistor arrangements $Q_1$ and $Q_2$, with the frequency range of oscillator 8 being thereby increased.

Oscillator 8 further includes transistors $Q_3$ and $Q_4$ connected in emitter follower configuration to insure rapid discharge of capacitors 64 and 66, thereby allowing higher frequencies to be generated.

Transistors $Q_5$ and $Q_8$ in oscillator 8 act as constant current sources for charging capacitors 64 and 66, respectively, thereby providing a relatively good linearity between the output voltage at terminal 50 and its frequency. Transistors $Q_6$ and $Q_7$ included in oscillator 8 are wired as diodes to compensate for the base to emitter voltage drop at transistors $Q_5$ and $Q_8$.

TIMING FOR FREQUENCY TO D.C. CONVERTER 2

Figure 3:
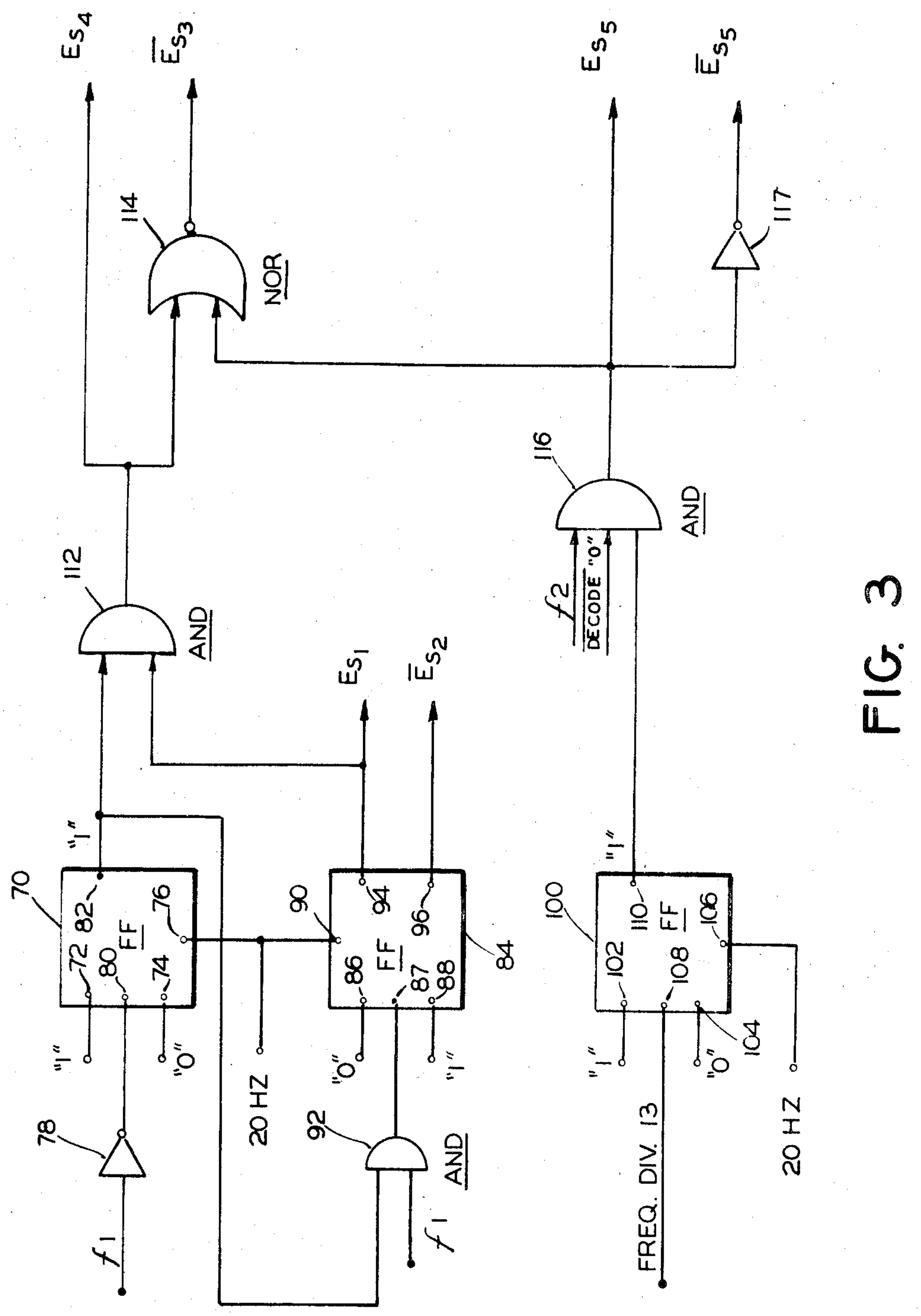
FIG. 3 is a diagram showing logic means for timing a frequency to d.c. converter 2 shown in FIG. 1.

With reference now to FIG. 3, the logic circuitry included in timing circuit 12 for operating switches $S_1 - S_5$ includes a bistable multivibrator commonly referred to as a flip-flop and designated by the numeral 70. Flip-flop 70 includes an input terminal 72 for receiving a logic "1" signal and an input terminal 74 for receiving a logic "0" signal from suitable signal sources (not shown). A reset terminal 76 receives a logic "1" signal from a 20 Hz clock. The signal from frequency divider 13 is applied through an inverting amplifier 78 to a control terminal 80. Flip-flop 70 provides a logic "1" output at an output terminal 82.

The logic "1" signal from flip-flop 70 at output terminal 82 thereof is applied to an AND gate 92 as is the signal from input source 11 having frequency $f_1$. The output from AND gate 92 is applied to a control terminal 87 of a flip-flop 84.

Flip-flop 84 has an input terminal 86 for receiving a logic "0" signal and an input terminal 88 for receiving a logic "1" signal from suitable signal sources (not shown). Flip-flop 84 has a set terminal 90 for receiving the logic "1" signal from the 20 Hz clock and provides signal $E_{S_1}$ at a logic "1" level at an output terminal 94 and a signal $E_{S_2}$ at a logic "0" level at an output terminal 96.

A flip-flop designated generally by the numeral 100 has an input terminal 102 for receiving a logic "1" signal and an input terminal 104 for receiving a logic "0" signal from suitable signal sources (not shown). Flip-flop 100 has a reset terminal 106 for receiving the logic "1" signal from the 20 Hz clock. A control terminal 108 receives the signal from frequency divider 13. Flip-flop 100 provides a signal at a logic "1" level at an output terminal 110.

The signal at output terminal 82 of flip-flop 70 and signal $E_{S_1}$ at output terminal 94 of flip-flop 84 are applied to an AND gate 112. AND gate 112 provides signal $E_{S_4}$ at a logic "1" level, and which signal is also applied to a NOR gate 114.

The signal from flip-flop 100 at output terminal 110 is applied to an AND gate 116 as is the signal from frequency divider 10 having frequency $f_2$ and an internally generated decode pulse at a logic "0" level. AND gate 116 provides signal $E_{S_5}$ at a logic "1" level and which signal is applied through an inverting amplifier 117 for providing signal $E_{S_5}$ at a logic "0" level. Signal $E_{S_5}$ is applied to NOR gate 114 which provides signal $E_{S_3}$ at a logic "0" level.

Figure 4:
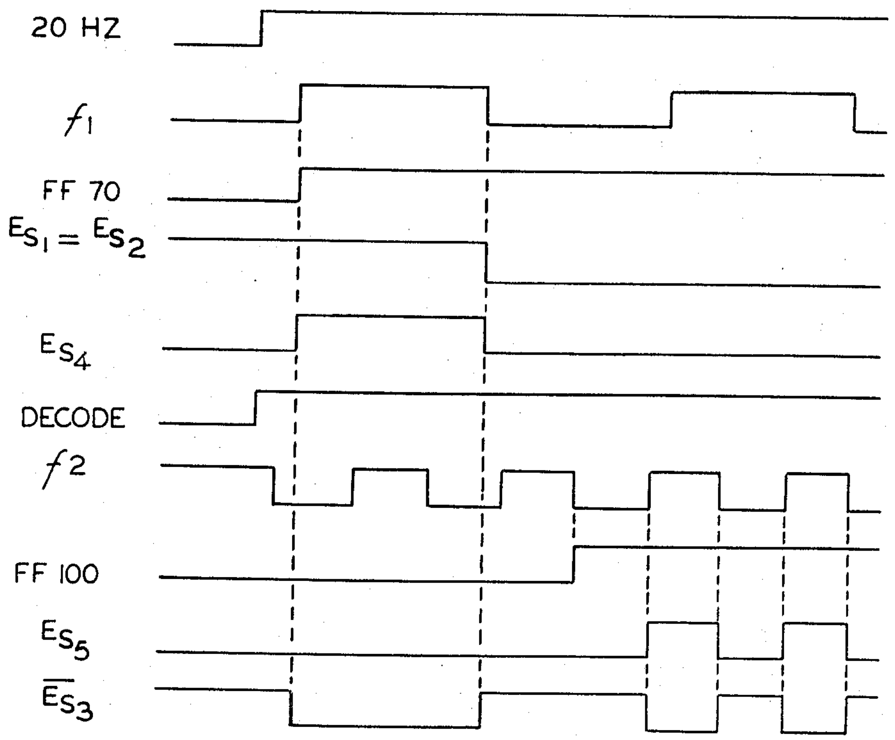
FIG. 4 is a diagrammatic representation of waveforms for signals provided by the logic means of FIG. 3.

Waveforms of the aforenoted logic signals are illustrated in FIG. 4.

When the signal from the 20 Hz clock is at logic "1", flip-flops 70 and 84 are controlled by their inputs. The output from flip-flop 70 is at logic "1" when input frequency $f_1$ is at logic "1" which has the effect of turning on or rendering conductive switches $S_1$ and $S_4$ and turning off or rendering non-conductive switch $S_3$, thus allowing the voltage associated with frequency $f_1$ to be converted to d.c. and charging capacitor 30 (FIG. 1). When frequency $f_1$ goes to logic "0", flip-flop 84 and $E_{S_4}$ are at logic "0" and $E_{S_3}$ is at logic "1" thereby holding the voltage on capacitor 30 and discharging capacitor 31 in preparation for the next charging sequence.

When feedback frequency $f_2$ changes from logic "1" to logic "0", flip-flop 100 is driven to logic "1", thereby allowing $E_{S_5}$ to follow frequency $f_2$. At this time, $E_{S_2}$ is at logic "1" which means that resistor $R_2$ in circuit 6 has been selected in preparation for converting frequency $f_2$. In other words, the voltage associated with frequency $f_2$ is converted to d.c. and stored on capacitor 32 each time switch $S_5$ is turned on or rendered conductive and switch $S_3$ is turned off or rendered non-conductive.

TIMING FOR SUCCESSIVE APPROXIMATION CIRCUIT 6

It will now be understood that there are a total of 15 multiplexed inputs ($E_{S_9}-E_{S_{23}}$) in successive approximation circuit 6 shown in FIG. 1, and which inputs must be successively switched through appropriate switches $S_9$ – $S_{23}$, corresponding resistors $R_1$ – $R_{15}$ and switch $S_8$ to capacitor 40.

Figure 5:
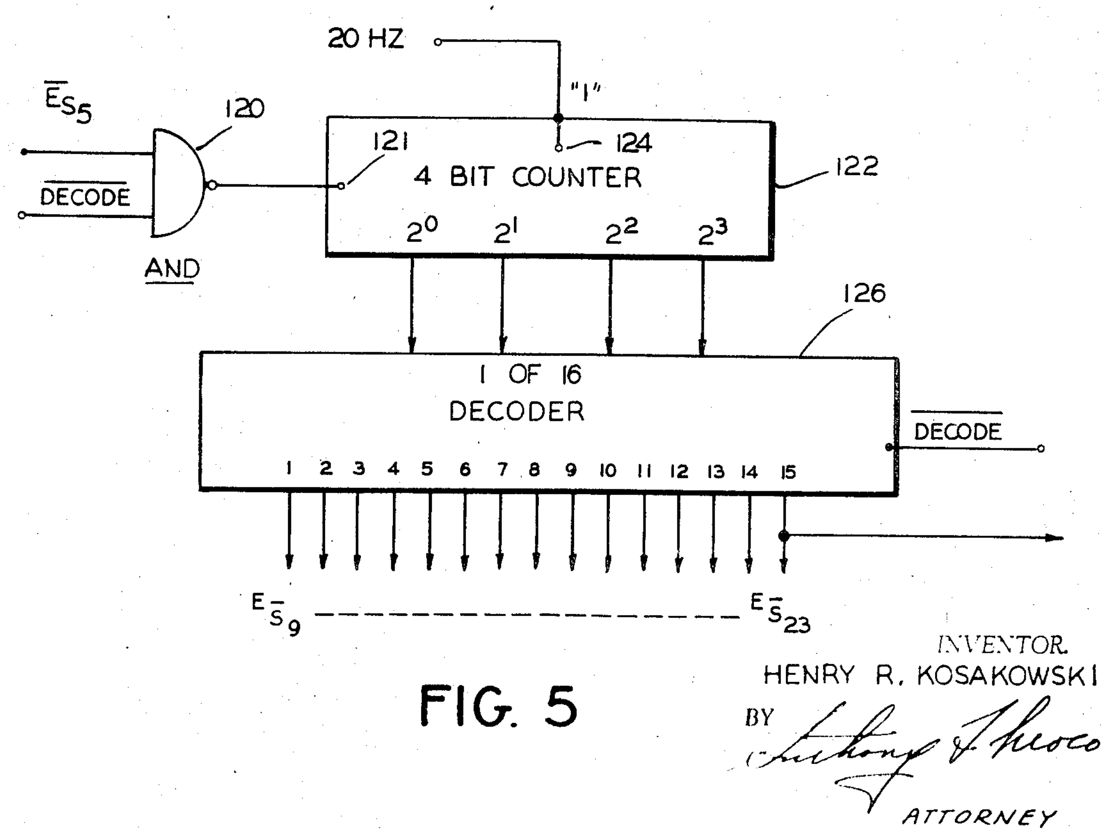
FIG. 5 is a diagram showing logic means for timing a successive approximation circuit 6 shown in FIG. 1.

With reference then to FIG. 5, there is shown an inverting AND gate 120 receiving signal $\overline{E}_{S_5}$ at logic "0" from amplifier 117 (FIG. 3) and the internally generated decode signal at logic "0". The output from gate 120 is applied to an input terminal 121 of a 4-bit counter 122 and the 20 Hz clock signal at logic "1" is applied to an input terminal 24 of counter 122. The outputs of the counter ($2^0$, $2^1$, $2^2$, $2^3$) are applied to a decoder 126, and which decoder provides output $\overline{E}_{S_9}-\overline{E}_{S_{23}}$ at logic "0" for operating the associated switches in successive approximation circuit 6.

Each time signal $\overline{E}_{S_5}$ changes from logic "0" to logic "1", counter 122 is updated and new outputs $\overline{E}_{S_9}-\overline{E}_{S_{23}}$ are decoded. This sequence continues until $\overline{E}_{S_{23}}$, the 15th and last output is decoded and prevents signal $\overline{E}_{S_5}$ from updating counter 122. The counter output remains unchanged until the counter is reset by the 20 Hz clock signal at logic "0". While the 20 Hz clock signal is at logic "0", counter 122 remains in the reset state.

Figure 6:
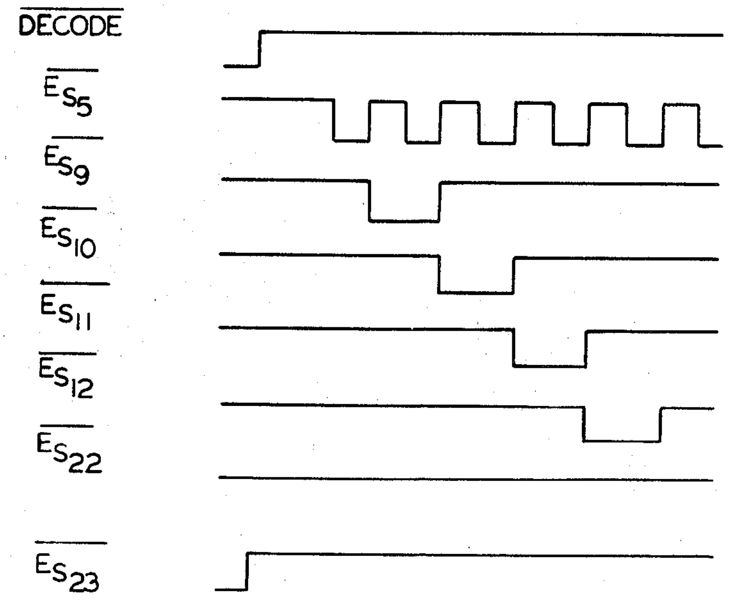
FIG. 6 is a diagrammatic representation showing waveforms for signals provided by the logic means of FIG. 5.

Waveforms of the aforenoted logic signals are illustrated in FIG. 6.

Figure 7:
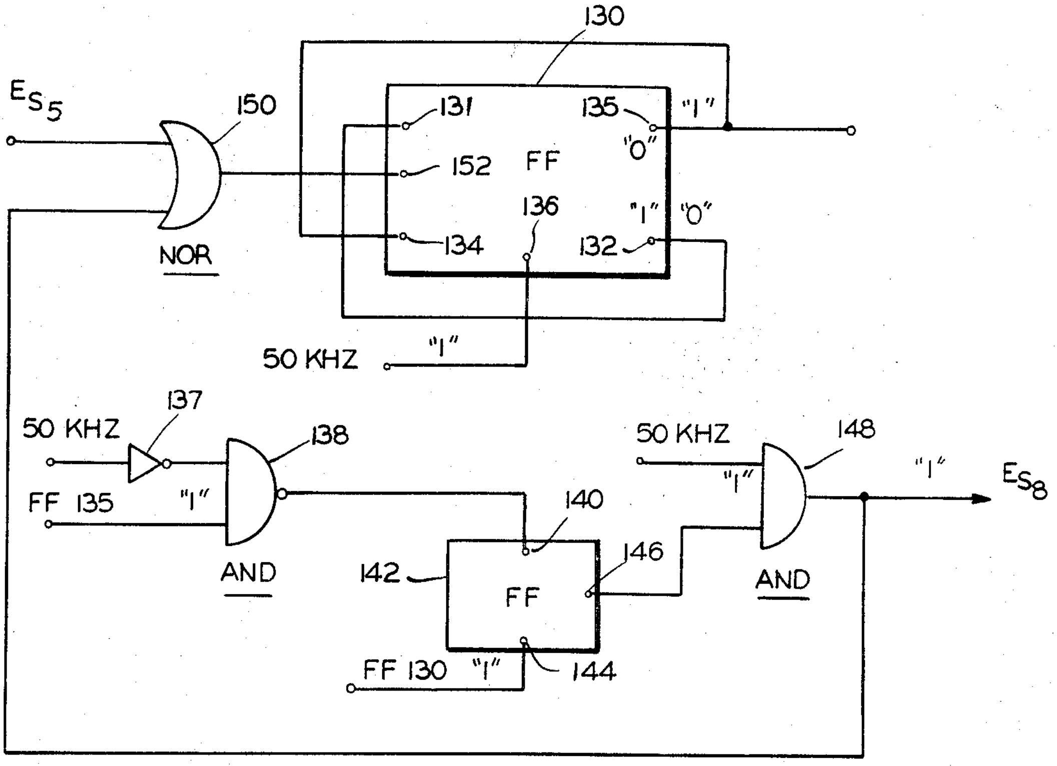
FIG. 7 is a diagram showing logic means for timing a sampling switch $S_8$ included in successive approximation circuit 6 shown in FIG. 1.

Each time counter 122 is updated, switch $S_8$ (FIG. 1) must be rendered conductive for a predetermined interval (10 microseconds, for example) to allow capacitor 40 to charge. The logic circuitry for accomplishing this is shown in FIG. 7.

Accordingly, a flip-flop designated by the numeral 130 has an input terminal 131 for receiving a logic "0" feedback signal provided at an output terminal 132, an input terminal 134 for receiving a logic "1" feedback signal provided at an output terminal 135 and a reset terminal 136 for receiving the logic "1" signal from the 50 KHz clock.

The logic "1" output from flip-flop 130 at output terminal 135 is applied to an inverting AND gate 138. The signal from the 50 KHz clock at logic "1" is applied to another input terminal of gate 138 through an inverting amplifier 137.

The output from gate 138 is applied to a set terminal 140 of a flip-flop 142 and the output at output terminal 135 of flip-flop 130 is applied to a reset terminal 144 of flip-flop 142. The output at output terminal 146 of flip-flop 140 is applied to an AND gate 148 as is the logic "1" 50 KHz clock signal. Gate 148 provides output signal $\underline{E}_{S_8}$ (logic "1") and which output is applied to a NOR gate 150 as is signal $\underline{E}_{S_5}$ from gate 116 (FIG. 1). NOR gate 150 provides a controlling output which is connected to a terminal 152 of flip-flop 130.

Thus, when signal $\underline{E}_{S_5}$ changes from logic "1" to logic "0", flip-flop 130 provides at output terminal 135 a signal at a logic "1" level which drives flip-flop 142 to logic "1" when the 50 KHz signal is at logic "0". Signal $E_{S_8}$ is effective for rendering switch $S_8$ conductive during the logic "1" portion of the 50 KHz signal. When switching output $S_8$ falls to logic "0", the output from flip-flop 130 at output terminal 135 falls to logic "0", whereupon flip-flop 142 provides a logic "0" signal and the sequence starts over.

Figure 8:
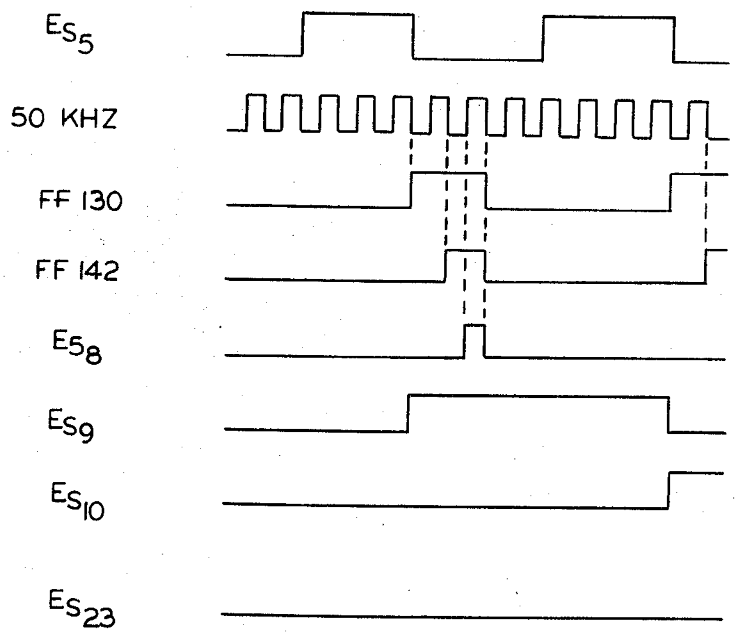
FIG. 8 is a diagrammatic representation of waveforms for signals provided by the logic means of FIG. 7.

Waveforms for the aforenoted signals are illustrated in FIG. 8.

TIMING FOR SAMPLE AND HOLD DISCHARGE

Figure 9:
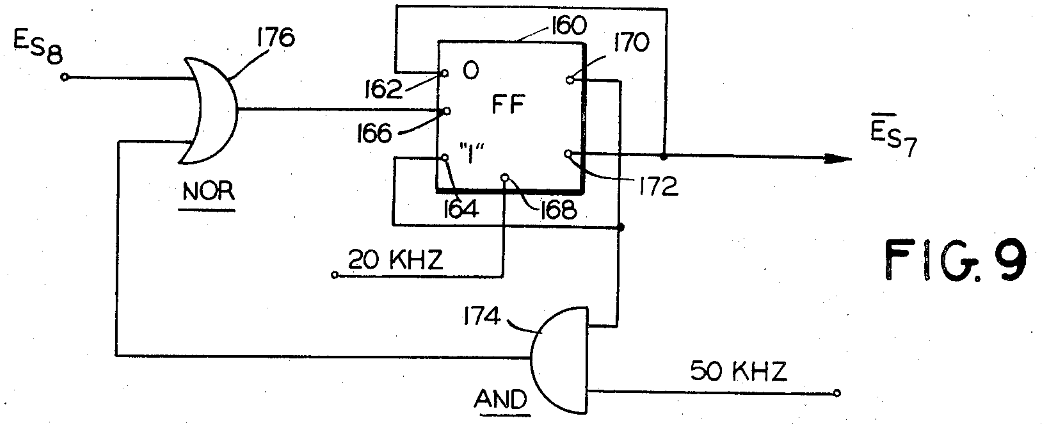
FIG. 9 is a diagram showing logic means for sample and hold means 20, 22 included in the frequency to d.c. converter shown in FIG. 1.

As heretofore noted, switches $S_6$ and $S_7$ shown in FIG. 1 are used for discharging capacitors 30 and 32, respectively, prior to performing each frequency to d.c. conversion. FIG. 9 shows the logic circuitry included in timing circuit 12 (FIG. 1) for accomplishing this task.

Thus, the circuitry includes a flip-flop 160 having an input terminal 162 for receiving a logic "0" feedback signal provided at an output terminal 172, an input terminal 164 for receiving a logic "1" feedback signal provided at an output terminal 170 and a reset terminal 168 for receiving the logic "1" 20 Hz clock signal.

The logic "1" output at output terminal 170 is applied to an AND gate 174 as is the logic "1" 50 KHz clock signal. The output from AND gate 174 is applied to a NOR gate 176 as is signal $\underline{E}_{S_8}$ from gate 148 (FIG. 7). NOR gate 176 provides an output which is applied to a control terminal 166 of flip-flop 160.

Figure 10:
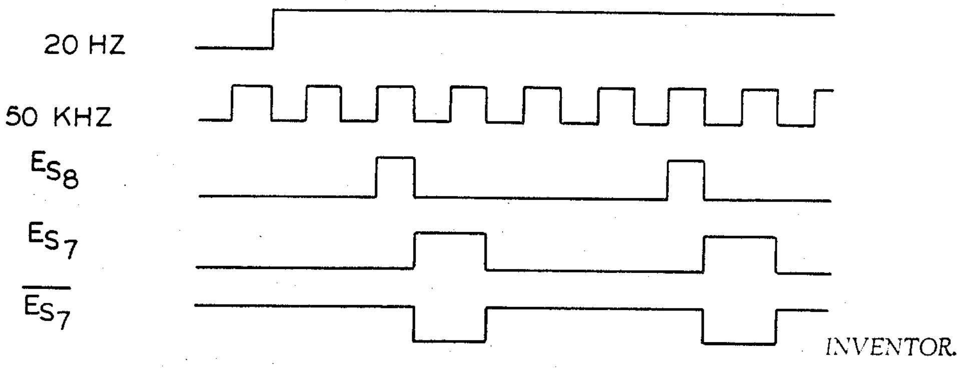
FIG. 10 is a diagrammatic representation showing waveforms for signals provided by the logic circuitry of FIG. 9.

The waveforms for the aforenoted signals are illustrated in FIG. 10.

OPERATION

With reference to the foregoing description of the invention and the figures relating thereto, the operational sequence is started by applying the input pulse train from pulse source 11 and the pulse train generated by voltage controlled oscillator 8 to timing circuit 12 which provides a logic "1" and logic "0" control outputs for controlling frequency to d.c. converter 2 and successive approximation circuit 6.

Frequency to d.c. converter 2 is affected by the logic outputs from timing circuit 12 for providing a pair of d.c. voltages corresponding to the frequencies of the aforenoted pulse trains. The d.c. voltages are compared by comparator 4 and the comparison voltage is applied to successive approximation circuit 6, and which circuit is controlled by the outputs from timing circuit 12 to provide an output for forcing voltage controlled oscillator 8 to increase or decrease its frequency of oscillation until the output of comparator 4 is zero.

Successive approximation 6 includes a network of resistors $R_1$ – $R_{15}$ for generating a control voltage for controlling oscillator 8. Each resistor is successively switched into a common node and allowed to charge or discharge capacitor 40 at a rate depending on the RC time constant of the capacitor and the level of the output from comparator 4. As each successively larger valued resistor is switched into the common node, the rate at which capacitor 40 charges or discharges is successively reduced. Consequently, the rate of increase or decrease of frequency from voltage controlled oscillator 8 continuously reduces, forcing the output of the oscillator to approach the proper frequency. The successive approximation process takes place when the 20 Hz clock signal is at a logic "1" level.

The frequency multiplication factor ($F_M$) is established by the factors Z and Y of dividers 10 and 13, respectively, and the attenuation factor X heretofore defined as $R_{28}/R_{26}$. Both division factors Y and Z are limited to integer values while the attenuation factor X can be any rational number. The magnitude of the multiplication factor depends solely on the ability of voltage controlled oscillator 8 to generate the required output frequency.

The digital output is obtained when binary counter 16 counts the cycles of the multiplied frequency during the logic "0" position of the 20 Hz clock signal.

It will now be understood that when using the apparatus of the invention there is virtually no restriction on the magnitude of the frequency multiplication. The frequency multiplication is a closed loop function for greatly improving accuracy and stability.

Although but a single embodiment of the invention has been illustrated and described in detail, it is to be expressly understood that the invention is not limited thereto. Various changes may also be made in the design and arrangement of the parts without departing from the spirit and scope of the invention as the same will now be understood by those skilled in the art.

WHAT IS CLAIMED IS

1. A pulse train to digital converter comprising:

a pulse source for providing input pulses at a first frequency;

an oscillator for providing pulses at a second frequency;

means for providing clock pulses;

timing means connected to the pulse source, the clock pulse means and the oscillator and responsive to the pulses at the first and second frequencies and to the clock pulses for providing a plurality of controlling outputs related to said frequencies;

converter means connected to the timing means for converting a first selection of outputs from the plurality of controlling outputs to first and second d.c. voltages corresponding respectively to the first and second frequencies;

a comparator connected to the converter for comparing the first and second d.c. voltages and for providing a comparison voltage;

control means connected to the comparator and to the timing circuit and driven by a second selection of outputs from the plurality of controlling outputs for providing an output in accordance with the comparison voltage;

the oscillator connected to the control means with the output from said control means controlling the second frequency of the pulses from the oscillator; and a counter connected to the oscillator and to the clock pulse means and driven by the clock pulses for counting the pulses at the second frequency to provide a corresponding digital output.

2. A pulse train to digital converter as described by claim 1 wherein:

the timing means is driven by the clock pulses at a logic "1" level; and the counter is driven by the clock pulses at a logic "0" level.

3. A pulse train to digital converter comprising:

a pulse source for providing input pulses at a first frequency;

an oscillator for providing pulses at a second frequency;

means for providing clock pulses;

timing means connected to the pulse source, the clock pulse means and the oscillator and responsive to the pulses at the first and second frequencies and to the clock pulses for providing a plurality of controlling outputs related to said frequencies;

converter means connected to the timing means for converting a first selection of outputs from the plurality of controlling outputs to first and second d.c. voltages corresponding respectively to the first and second frequencies;

a comparator connected to the converter for comparing the first and second d.c. voltages and for providing a comparison voltage;

control means connected to the comparator and to the timing circuit and driven by a second selection of outputs from the plurality of controlling outputs for providing an output in accordance with the comparison voltage;

the oscillator connected to the control means with the output from said control means controlling the second frequency of the pulses from the oscillator; and The control means including a plurality of resistors; a corresponding plurality of normally open switches, each of which is successively closed to connect an associated resistor of the plurality of resistors to the comparator in response to one of the second selection of outputs from the plurality of controlling outputs from the timing circuit; a capacitor; and a normally open switch connecting the plurality of resistors to the capacitor and closed by one of the second selection of outputs for affecting the charging and discharging rate of the capacitor.

4. A pulse train to digital converter comprising:

a pulse source for providing input pulses at a first frequency;

an oscillator for providing pulses at a second frequency;

means for providing clock pulses;

timing means connected to the pulse source, the clock pulse means and the oscillator and responsive to the pulses at the first and second frequencies and to the clock pulses for providing a plurality of controlling outputs related to said frequencies;

converter means connected to the timing means for converting a first selection of outputs from the plurality of controlling outputs to first and second d.c. voltages corresponding respectively to the first and second frequencies;

a comparator connected to the converter for comparing the first and second d.c. voltages and for providing a comparison voltage;

control means connected to the comparator and to the timing circuit and driven by a second selection of outputs from the plurality of controlling outputs for providing an output in accordance with the comparison voltage;

the oscillator connected to the control means, with the output from said control means controlling the second frequency of the pulses from the oscillator; and The converter means including means for providing a reference signal; an integrator connected to the reference signal means and to the timing means and responsive to certain of the selected outputs from the timing means for integrating the reference signal during one-half cycle of the first frequency; first sample and hold means connected to the integrator and connected to the timing means and driven by certain of the outputs from the timing circuit related to the first frequency for converting the integrator output to the first output corresponding to the first frequency; and second sample and hold means connected to the integrator and to the timing circuit and driven by certain of the selected outputs from the timing circuit related to the second frequency for converting the integrator output to the second output corresponding to the second frequency.

5. A pulse train to digital converter as described by claim 4 including:

a first frequency divider connected to the pulse source for dividing the first frequency of the pulses therefrom by a factor Y and for applying pulses at said divided frequency to the timing circuit;

a second frequency divider connected to the oscillator for dividing the second frequency of the pulses therefrom by a factor Z and for applying pulses at said divided frequency to the timing circuit;

a first resistor and a second resistor connected in parallel and connecting the reference signal source to the integrator, and said first and second frequencies being separated by an attenuation factor X corresponding to the ratio of the second resistor to the first resistor; and the second frequency corresponding to the first frequency multiplied by a factor Z/XY where X, Y and Z are positive integers.

* * * * *